(12) United States Patent
Goela et al.

(10) Patent No.: US 9,200,366 B2
(45) Date of Patent: Dec. 1, 2015

(54) METHOD OF MAKING POLYCRYSTALLINE MONOLITHIC MAGNESIUM ALUMINATE SPINELS

(75) Inventors: Jitendra S. Goela, Andover, MA (US); Heather A. G. Stern, Littleton, MA (US)

(73) Assignee: Rohm and Haas Electronic Materials LLC

(*) Notice: Subject to any disclaimer, the term of this patent is extended or adjusted under 35 U.S.C. 154(b) by 793 days.

(21) Appl. No.: 13/314,507

(22) Filed: Dec. 8, 2011

(65) Prior Publication Data

US 2012/0076928 A1  Mar. 29, 2012

Related U.S. Application Data

(62) Division of application No. 12/229,745, filed on Aug. 26, 2008, now Pat. No. 8,142,913.

(60) Provisional application No. 60/966,313, filed on Aug. 27, 2007.

(51) Int. Cl.
*C23C 16/40* (2006.01)
*C04B 35/443* (2006.01)
*C04B 35/622* (2006.01)

(52) U.S. Cl.
CPC .............. *C23C 16/403* (2013.01); *C04B 35/443* (2013.01); *C04B 35/62218* (2013.01); *C04B 2235/786* (2013.01); *C04B 2235/95* (2013.01); *Y10T 428/12667* (2015.01)

(58) Field of Classification Search
CPC .............................. C23C 16/403; C23C 16/40
USPC ...................... 427/255.31, 255.34, 255.7, 250
See application file for complete search history.

(56) References Cited

U.S. PATENT DOCUMENTS

| | | | |
|---|---|---|---|
| 3,736,158 A | 5/1973 | Cullen et al. | |
| 3,767,745 A | 10/1973 | Gazza et al. | |
| 3,883,313 A | 5/1975 | Cullen et al. | |
| 3,974,249 A | 8/1976 | Roy et al. | |
| 4,066,481 A * | 1/1978 | Manasevit et al. | 117/90 |
| 4,882,300 A | 11/1989 | Inoue et al. | |
| 5,152,940 A * | 10/1992 | Shibata et al. | 264/1.21 |

(Continued)

FOREIGN PATENT DOCUMENTS

| | | | |
|---|---|---|---|
| EP | 0208506 | * | 1/1987 |
| JP | 62-725556 | * | 4/1987 |

(Continued)

OTHER PUBLICATIONS

Villalobos, G.R., et al., "Transparent Ceramics: Magnesium Aluminate Spinel". Materials Science and Technology, 2005 NRL Review, pp. 171-172.*

(Continued)

*Primary Examiner* — Bret B Chen
(74) *Attorney, Agent, or Firm* — John J. Piskorski (57) ABSTRACT

Methods of making polycrystalline monolithic magnesium aluminate spinels are disclosed. The polycrystalline monolithic magnesium aluminate spinels have small grain sizes and may be deposited on substrates as thick one-piece deposits. The polycrystalline monolithic magnesium aluminate spinels may be prepared and deposited by chemical vapor deposition using magnesium and aluminum gaseous precursors.

5 Claims, 5 Drawing Sheets

(56) References Cited

U.S. PATENT DOCUMENTS

| | | | | |
|---|---|---|---|---|
| 5,547,706 | A | * | 8/1996 | Ackerman .................. 427/166 |
| 5,702,654 | A | * | 12/1997 | Chen et al. ..................... 264/82 |
| 5,858,496 | A | * | 1/1999 | Fisher et al. ................... 428/44 |
| 6,063,951 | A | * | 5/2000 | Kim et al. ..................... 438/779 |
| 6,280,598 | B1 | * | 8/2001 | Barton et al. ................. 205/210 |
| 6,844,084 | B2 | | 1/2005 | Kokta et al. |
| 7,611,661 | B1 | * | 11/2009 | Villalobos et al. ............ 264/681 |
| 7,875,311 | B1 | * | 1/2011 | Villalobos et al. ............ 427/215 |
| 8,080,175 | B2 | * | 12/2011 | Chen ...................... 252/301.4 R |
| 2002/0098776 | A1 | * | 7/2002 | Dopper ............................. 451/2 |
| 2003/0230484 | A1 | * | 12/2003 | Jain et al. ...................... 204/424 |
| 2004/0213907 | A1 | * | 10/2004 | Todd et al. ............... 427/255.18 |
| 2004/0247787 | A1 | * | 12/2004 | Mackie et al. ............. 427/248.1 |
| 2005/0145968 | A1 | * | 7/2005 | Goela et al. ................... 257/437 |
| 2005/0164867 | A1 | | 7/2005 | Krell et al. |
| 2006/0217260 | A1 | | 9/2006 | Villalobos et al. |
| 2007/0075403 | A1 | * | 4/2007 | Sakashita et al. ............ 257/626 |
| 2007/0087204 | A1 | | 4/2007 | Bayya et al. |
| 2008/0011290 | A1 | * | 1/2008 | Goldman et al. ............. 126/655 |

FOREIGN PATENT DOCUMENTS

| | | | |
|---|---|---|---|
| WO | WO 93/05520 | | 3/1993 |
| WO | WO 03/068501 | * | 8/2003 |
| WO | WO 2005/031047 | | 4/2005 |

OTHER PUBLICATIONS

Bhattacharyya, Alak, et al., "Preparation and Characterization of Magnesium Aluminate Spinel for SOx Abatement in Fluid Catalytic Cracking". In Characterization and Catalyst Development; Bradley, S. et al.; ACS Symposium Series; American Chemical Society: Washington, DC, 1989.*

Ihara, Masaru, et al., "Vapor Phase Epitaxial Growth of Mgo—Al2O3". J. Electrochem. Soc.: Solid-State Science and Technology, vol. 129, No. 11, Nov. 1982, pp. 2569-2573.*

Mathur, Sanjay, et al., "Chemical Vapor Deposition of MgAl2O4 Thin Films Using Different Mg—Al Alkoxides: Role of Precursor Chemistry". Chem. Mater. 2004, 16, pp. 1304-1312.*

Mikami et al., "Formation of Si Epi./MgO $Al_2O_3$ Epi./$SiO_2$/Si and Its Epitaxial Film Quality", Extended Abstracts of the $15^{th}$ Conference on Solid State Devices & Materials, Tokyo, 1983, pp. 31-34.

Boo et al., "MOCVD of $MgAl_2O_4$ thin films using new single molecular precursors: application of β-hydrogen elimination to the growth of heterometallic oxide films", Applied Surface Science 169-170, 2001, pp. 581-586.

Rocheleau et al., "MOCVD Deposition of $MgAl_2O_4$ Films Using Metal Alkoxide Precursors", Chem. Mater. 6, 1994, pp. 1615-1619.

Putkonen et al., "Magnesium aluminate thin films by atomic layer deposition from organometallic precursors and water", Thin Solid Films, 466, 2004, pp. 103-107.

Mathur et al., "Chemical Vapor Deposition of $MgAl_2O_4$ Thin Films Using Different Mg—Al Alkoxides: Role of Precursor Chemistry", Chem. Mater. 16, 2004, pp. 1304-1312.

Veith et al., A Single-Source CVD Precursor to $MgAl_2O_4$: [Mg{($O^tBu$)$_2$AlH$_2$}$_2$]**, Chem. Vap. Deposition, 5, 1999, No. 2, pp. 87-90.

Koh et al., "Single-Source CVD of $MgAl_2O_4$**", Chem. Vap. Deposition, 4, 1998, No. 5, pp. 192-195.

Ihara et al., "Vapor Phase Epitaxial Growth of MgO—$Al_2O_3$", J. Electrochem. Soc.: Solid State Science and Technology, vol. 129, No. 11, Nov. 1982, pp. 2569-2573.

Egami et al., "Crystalline correlation of epitaxial Si films with underlying spinel films in Si/MgO Al2O3) spinel/Si structure", Appl. Phys. Lett, 43 (8), Oct. 15, 1983, pp. 757-759.

European Search Report of corresponding European Patent Application No. EP 08 16 2874.

Sanjay et al, "Chemical Vapor Deposition of MgAl2O4 Thin Films Using Different Mg. Al Alkoxide: Rose or Precursor Chemistry"; Chemistry of Materials, vol. 16, No. 7, Mar. 4, 2004, pp. 1304-1312.

Cook, Ronald; "A new powder production route for transparent spinel windows: powder synthesis and window properties"; Proceedings of SPIE, 2005, vol. 5786, pp. 41-47.

* cited by examiner

METHOD OF MAKING POLYCRYSTALLINE MONOLITHIC MAGNESIUM ALUMINATE SPINELS

This Application is a Divisional of U.S. Non-Provisional application Ser. No. 12/229,745 filed Aug. 26, 2008, now U.S. Pat. No. 8,142,913, which application claims the benefit of priority under 35 U.S.C. §119(e) to U.S. Provisional Application No. 60/966,313, filed Aug. 27, 2007, the entire contents of which applications are incorporated herein by reference.

The present invention is directed to polycrystalline monolithic magnesium aluminate spinels. More specifically, the present invention is directed to polycrystalline monolithic magnesium aluminate spinels with small grain sizes and may form thick deposits.

There is considerable interest in producing high quality spinels for use as multi-spectral optical material covering the visible to mid-wavelength infrared region. Spinels have superior properties over other materials currently used as multi-spectral optical material. Such properties include high hardness, i.e. 1645 Kg/mm$^2$ (Knoop, 200 g load) high flexural strength, i.e. 27,000 psi, low refractive index, i.e. 1.639 at 4 microns, and high resistance to rain and sand erosion. Spinels are preferred over other competing materials such as aluminum oxynitride (ALON), sapphire, zinc sulfide, zinc selenide and magnesium fluoride. Spinels have better transmission in the mid wavelength infrared range than ALON and sapphire. Spinel is also cubic with uniform properties versus sapphire which is hexagonal with nonuniform properties. In comparison to zinc sulfide, zinc selenide and magnesium fluoride, spinels have better mechanical properties, and area more durable with high resistance to rain and sand erosion.

Currently bulk spinels are produced by sintered powder processing techniques but are still in the development phase. Such sintered processing techniques may have made some progress in producing dense material with acceptable properties, but important issues regarding process yields and reproducibility remain unsolved. Additionally, such bulk spinels exhibit large inclusions which decrease light transmission in the visible to mid-wavelength infrared regions and increase absorption and scattering of the light. Another problem with sintered spinels is that they have large grains (150 microns and greater) and often have bimodal grain structure which consists of clusters of small and large grains. Large grains may be from powder agglomerates that quickly sinter together and trap the original powders to form a porous structure. Large grains decrease the strength of the spinels to make them difficult to fabricate into good optical surfaces for mirrors and windows due to grain pull-out.

Another issue with sintered processed spinels is the difficulty of embedding electrically conductive metallic grids in spinel windows and domes. Such windows and domes are typically used in aircraft of various types as part of their radar or navigation apparatus. Spinels may function as insulators and are used to protect the electrically conductive metallic grids from electromagnetic interference. Embedding the electrically conductive metallic grids in sintered spinels presents many challenges in bonding a precision-polished spinel dome or window onto another precision dome or window with grids on the bonding surface. The mating surfaces have to be made very precise for obtaining good surface contact and this increases the fabrication cost. This is particularly difficult in domes due to their curved shape. One technique used is to apply a thin layer of glassy material in between the mating surfaces to promote adhesion through the glass layer. This requires glass to have a close refractive index match to the dome material.

Spinels may also be made by chemical vapor deposition processes; however, chemical vapor deposition processes produce spinels of thin films, i.e. 1 μm or less, which are unsuitable for windows and domes. The article Mikami, M., Y. Hokari, K. Egami, H. Tsuya, M. Kanamori (1983). *Formation of Si Epi./MO Al$_2$O$_3$ Epi./SiO$_2$/Si and its Epitaxial film Quality*. Extended Abstracts of the 15$^{th}$ Conference on solid State Devices and Materials Tokyo 1983: 31-34. discloses epitaxial growth of MgOAl$_2$O$_3$ on silicon substrates. The reactants used were Al, MgCl$_2$, H$_2$, CO$_2$ and HCl. Hydrochloric acid was used to convert Al to AlCl$_3$ which was then transported to the reaction zone. Nitrogen was used as a carrier gas. The growth rate achieved was only 0.08 μm/minute (0.5 μm/hour). The deposit was a film of only 0.1 μm to 0.8 μm. The authors indicated low growth rate and formation of cracks in the spinel films as issues in trying to grow thicker deposits on the silicon.

In addition to all inorganic precursors, metal organic (MO) precursors also have been used to produce thin film spinels by chemical vapor deposition. Many of the studies have used a single source of MO precursors such as metal alkoxides. Such alkoxides are typically moisture sensitive and produce spinels at low pressures of $1 \times 10^{-6}$ to 0.5 Torr which require more powerful vacuum pumps than high pressures and have low deposition rates such as 8.5 μm/hour. In addition to alkoxides, MOs such as Al(CH$_3$)$_3$ and Mg(C$_5$H$_5$)$_2$ may be used to produce spinel films; however, these materials are moisture sensitive and pyrophoric and are difficult to use to produce monolithic materials having thicknesses of 1 mm and thicker. Another reason why MO precursors are not desirable is that they are relatively expensive and this increases the cost of the monolithic material produced. MO precursors are generally used for coating at low temperature depositions thus the producing bulk materials requires long periods and increases the cost of manufacturing bulk materials. Accordingly, there is still a need for monolithic spinels having properties which are suitable for use in mirrors, domes, windows and other articles.

In one aspect a composition is composed of polycrystalline monolithic magnesium aluminate with a grain size of 70 μm or less and a thickness of at least 0.5 mm.

In another aspect a method includes: a) providing gaseous precursors of magnesium aluminate; b) reacting the gaseous precursors; and c) depositing polycrystalline monolithic magnesium aluminate on a substrate at a deposition rate of 0.5 μm to 5 μm per minute.

In a further aspect an article includes polycrystalline monolithic magnesium aluminate with a grain size of 70 μm and a thickness of at least 0.5 mm.

In an additional aspect an article includes one or more electrically conductive and selectively passivated patterns, each pattern includes one or more metal layers and is joined directly to and between layers of polycrystalline monolithic magnesium aluminate with grain sizes of 70 μm or less and thicknesses of at least 0.5 mm.

In yet another aspect a method includes: a) providing a first layer of polycrystalline monolithic magnesium aluminate with a grain size of 70 μm or less and a thickness of at least 0.5 mm; b) depositing an electrically conductive and selectively passivated pattern on the first layer of the polycrystalline monolithic magnesium aluminate with a grain size of 70 μm or less and a thickness of at least 0.5 mm; and c) depositing a second layer of monolithic magnesium aluminate with a grain size of 70 μm or less and a thickness of at least 0.5 mm on the electrically conductive selectively passivated pattern opposite the first layer of polycrystalline monolithic magnesium aluminate to form an article.

The polycrystalline monolithic magnesium aluminate compositions are theoretically dense, i.e. 98% and greater, substantially void free, i.e. not porous, of high purity, i.e. 99% and greater, have small grain sizes thus providing high values of hardness and flexural strength in the material. Small grain sizes also make the compositions easier to polish than large grain sizes. The compositions also have good physical, mechanical, optical and thermal properties. The polycrystalline monolithic magnesium aluminate compositions may be deposited on substrates crack-free to make near-net shaped parts such as domes, windows, lenses, mirrors, beam splitters and reflectors. Domes and windows may be used to enclose electrically conductive metallic grids. Such domes and windows may be used as parts for radar and navigational apparatus or act as shields to electromagnetic interference radiation, radio frequency interference radiation and other undesired forms of radiation. The articles made with the polycrystalline monolithic magnesium aluminate compositions may be used for subterranean, terrestrial, marine, aeronautical vessels and structures.

As used throughout this specification, the following abbreviations have the following meaning, unless the context clearly indicates otherwise: ° C.=degrees Centigrade; K=degrees Kelvin; g=gram; Kg=kilograms; nm=nanometer; slpm=standard liters per minute; CVD=chemical vapor deposition; PVD=physical vapor deposition; CCVD=combustion chemical vapor deposition; CACCVD=controlled atmosphere combustion chemical vapor deposition; Å=angstrom=$10^{-10}$ meters; m=meters; mm=millimeters; cm=centimeters; cc=cubic centimeters; ohm-cm=electrical resistivity; μm=microns=micrometers=$10^{-6}$ meters; UV=ultraviolet; IR=infrared; ohm/square=unit of sheet resistance; GHz=gigahertz; Hz=hertz=a periodic occurrence of once per second has a frequency of 1 Hz; Torr=torr=a unit of pressure=1 mm Hg at 0° C.=133.322368 pascals; psi=pounds per square inch=0.06805 atmospheres; 1 atm=$1.01325 \times 10^6$ dynes/cm$^2$; MPa=megapascals; GPa=gigapascals; W=Watts; A/dm$^2$=amperes/decimeter squared; and wt %=percent by weight; W/mK=thermal conductivity; EMI=electromagnetic interference; RFI=radio frequency interference; aspect ratio=length/diameter of the article; and MWIR=mid-wavelength infrared region (3-5 microns).

The term "monolithic" means composed of one solid piece. Magnesium aluminate=magnesium aluminum oxide=$MgAl_2O_4$. The term "spinel"=magnesium aluminate.

All percentages are by weight unless otherwise noted. All numerical ranges are inclusive and combinable in any order, except where it is logical that such numerical ranges are constrained to add up to 100%.

The compositions are composed of polycrystalline monolithic magnesium aluminate spinels with a grain size of 70 μm or less and a thickness of at least 0.5 mm. The polycrystalline monolithic magnesium aluminate spinels are β-cubic which enables a uniformity of properties.

The polycrystalline monolithic magnesium aluminate spinels are prepared by CVD from gaseous precursors of elemental magnesium, aluminum compounds and elemental oxygen or gaseous compounds containing oxygen. The gaseous precursors react with each other at a molar ratio of 1:2:4 to produce polycrystalline monolithic aluminate spinels which are at least 98% pure, typically 99.999% pure and greater. The CVD methods provide spinels which are suitable for multi-spectral optical applications covering the wavelength region, i.e. 0.2 to 6 μm.

Magnesium is used in its elemental form as it has sufficient vapor pressure of from 0.7 to 3 Torr to form a gas at reaction temperatures in the CVD chamber. Sources of elemental magnesium include, but are not limited to, inorganic magnesium compounds, such as magnesium halides, such as $MgCl_2$, $MgBr_2$, $MgI_2$, $MgF_2$, and mixtures thereof. Typically, $MgCl_2$ is used as the source of magnesium for the spinels.

The magnesium compounds are placed in a retort of a CVD chamber as a liquid or a solid. The retort is heated at temperatures of 500° C. to 1000° C., typically from 650° C. to 950° C., to generate gaseous elemental magnesium metal. Typically, magnesium is sublimated. Vapor pressures for magnesium compounds at such temperatures range from 0.7 to 10 Torr, or from 1 to 8 Torr.

Aluminum compounds include, but are not limited to, inorganic aluminum compounds, such as aluminum halides, such as $AlCl_3$, $AlBr_3$, $AlI_3$ and $AlF_3$, aluminum carbonyls, such as $AL(CO)_3$, and aluminum acetonates, such as aluminum acetylacetonate, and mixtures thereof. Typically, aluminum halides and aluminum acetonates are used as the source of aluminum. More typically, aluminum halides and aluminum acetylacetonate are used as a source of aluminum. Most typically aluminum halides, such as $AlCl_3$, are used.

Aluminum metal or an aluminum compound is placed in a retort of a CVD chamber as a liquid or a solid. If aluminum metal is used, it is reacted with a halide and organic in situ to provide the desired compound. The retort is heated to temperatures of 550° C. to 850° C. or such as from 600° C. to 700° C. Vapor pressures for the aluminum compounds at such temperatures range from 0.1 to 6 Torr or from 0.5 to 4 Torr.

Elemental oxygen or oxygen containing compounds are provided from sources outside the CVD chamber and are pumped into the furnace using conventional apparatus. Sources of oxygen include, but are not limited to, gaseous $O_2$, $CO_2$, $NO_2$, $SO_2$, $H_2O_2$, $O_3$, $N_2O$ and $H_2O$. Typically gaseous $O_2$, $CO_2$, $N_2O$ and $H_2O$ are used as sources of oxygen.

The polycrystalline monolithic magnesium aluminate spinels have grain sizes of 70 μm and less. Typically the spinels have grain sizes of 1 μm to 60 μm, or such as from 2 μm to 50 μm or such as from 5 μm to 30 μm.

Such small grain sizes provide for flexural strength in the spinels such that they do not crack during formation and use. Flexural strengths may range from 150 Mpa to 300 Mpa. The Young's Modulus may range from 170 to 290 Gpa.

The spinels are deposited on substrates at temperatures of 700° C. to 1400° C. or such as from 800° C. to 1300° C. or such as from 900° C. to 1200° C. Typically the spinels are deposited on the substrates at temperatures of 900° C. to 1100° C.

Figure 1:
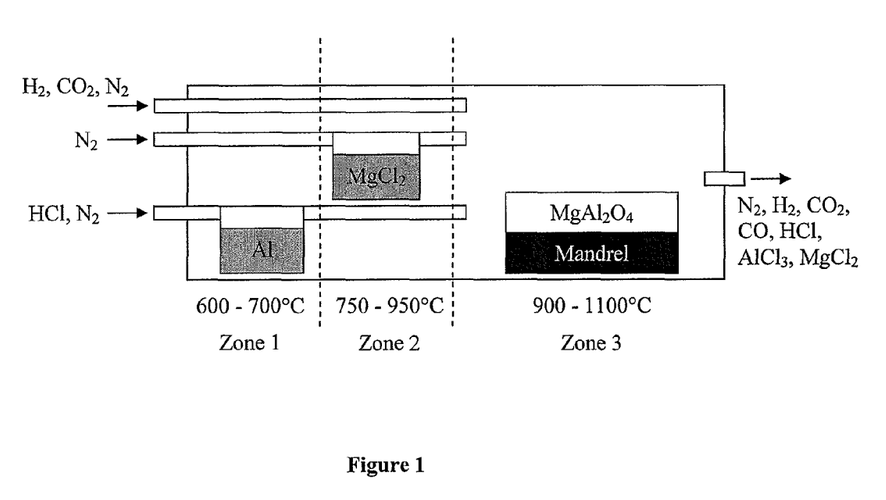
FIG. 1 is a schematic of a chemical vapor deposition furnace for producing spinels.

The spinels are deposited on substrates in CVD chambers at deposition rates of 0.1 to 5 μm/minute or such as from 0.5 to 2 μm/minute. CVD chambers typically include a quartz tube. The tubes may vary in size. Typically they are 15 cm in diameter by 100 cm long. FIG. 1 is a schematic of a quartz tube for CVD deposition of polycrystalline monolithic magnesium aluminate formed using a mixture of $AlCl_3$, $MgCl_2$, $CO_2$, HCl, $H_2$ and $N_2$. The quartz tube 10 is heated with a clam shell tube furnace (not shown) which has a temperature capability of 1200° C. In general the quartz tube 10 has three zones. The first two zones 12 and 14 are used to heat the metallic precursors, such as Al metal and $MgCl_2$. Zone 1 may range from 600° C. to 700° C. and zone 2 may range from 750° C. to 950° C. The third zone 16 is used to deposit spinel 18 on ceramic, quartz, metallic or graphite mandrels 20. Deposition temperatures in zone 3 may range from 900° C. to 1100° C. The precursors are loaded in retorts 22 and 24, which may be made of quartz, stainless steel, or ceramic materials. Examples of ceramic materials for retorts and mandrels are graphite, Si, SiC, $Si_3N_4$, BN, $B_4C$, $Al_2O_3$, AlN and $MoSi_2$. Examples of metals for retorts and mandrels are Ti, Mo and W.

Inert carrier gases, such as argon and nitrogen are used to transport precursors from the retorts to the deposition area 26. The deposition area typically includes four rectangular mandrel plates assembled as a rectangular open box. On one side the spinel precursors and oxygen source are introduced into the deposition area through separate injectors 28, 30 and 32. On the exhaust side a baffle plate (not shown) is provided to direct the reagent flow to the mandrel. After the reaction the products of the reaction and unused reagents pass through filters (not shown) to trap any particulate, acid vapors, such as HCl, and water vapors then pass through a vacuum pump (not shown) and any exhaust gases are vented 34 to the atmosphere.

In general the flow rates of the precursors and carrier gases are high. Typically, flow range from 0.5 slpm to 200 slpm, or such as from 1 slpm to 100 slpm, or such as from 5 slpm to 50 slpm. Typically the flow rates for the aluminum and magnesium precursors range from 0.5 slpm to 5 slpm, or such as from 0.5 slpm to 2 slpm. Flow rates for oxygen and its compounds, typically, range from 1 slpm to 10 slpm, or such as from 2 slpm to 5 slpm. Flow rates for carrier gases typically range from 1 slpm to 10 slpm or such as from 2 slpm to 5 slpm.

The polycrystalline monolithic magnesium aluminate forms deposits having a thickness of 0.5 mm and greater. Typically the deposit thickness ranges from 1 mm to 20 mm or such as from 5 mm to 10 mm.

After deposition the near-net shaped spinel may be surface treated to achieve a desired roughness. The deposits have a hardness of 1500 Kg/mm² to 1650 kg/mm² (Knoop, 200 g load) and a fracture toughness of 1.3 MPa/m to 1.7 MPa/m. Accordingly, the spinels are typically surface treated with diamond polishing pads. The hardness of the spinels enables their use as grocery scanners and for military armor applications.

The spinels also have high thermal conductivities of 12 W/mK to 18 W/mK at 298° K and a thermal expansion of $5\times10^{-6} K^{-1}$ to $6\times10^{-6} K^{-1}$ at 298° K. Such thermal properties enable the spinels to be used in ceramics industries where high temperature resistant parts are required.

The spinels also have a variety of applications for optical components such as crack-free, near-net shaped lenses, windows, beam splitters, domes and reflectors. Such articles may be used in subterranean, terrestrial, marine and aeronautical vessels and structures. For example, the windows and domes may be used in aircraft and missiles for targeting and reconnaissance applications in the visible to MWIR wavelength regions. Domes and windows may be used to enclose electrically conductive metallic grids. Such domes and windows may be used as parts for radar and navigational apparatus or act as shields to electromagnetic interference radiation, radio frequency interference radiation as well as other forms of radiation.

The electrically conductive metallic grids are selectively passivated to protect the grids from corrosive and reductive conditions under which the spinel is applied. The electrically conductive grids may be composed of a metal, which is tolerant of the harsh conditions. Such metals are intrinsically passive (inert) and do not need to be encapsulated with an additional passivation coat. However, many metals are corroded or reduced under the harsh conditions used to apply the materials which encase the patterns. Such metals are selectively passivated by encapsulating them with one or more layers of an inert material.

Metal layers as well as passivation layers are selectively deposited on the spinels to form a pattern. Generally, such patterns are a grid where the electrically conductive metal layers are in electrical communication with each other. A bus bar may be joined to the pattern to form electrical communication between the pattern of the article and another electronic component.

Metals used have electrical resistivities ranging from 50 micro-ohm-cm or less, or such as 50 micro-ohm-cm to 0.5 micro-ohm-cm, or such as from 45 micro-ohm-cm to 1 micro-ohm-cm, or such as from 20 micro-ohm-cm to 5 micro-ohm-cm. Measurements for electrical resistivity are at 25° C.

Suitable metals include, but are not limited to, noble metals such as gold, silver, platinum, palladium, and their alloys. Non-noble metals also may be employed. Examples of non-noble metals are copper, cobalt, chromium, tantalum, beryllium, nickel, molybdenum, tungsten, rhodium, iridium, ruthenium, nickel, titanium, tin, and alloys thereof. Such metals are deposited to a thickness such that the sheet resistivity of the metal and metal alloy layers range from 10 ohms/square or less, or such as 1 ohm/square to 10 ohms/square, or such as from 0.005 ohms/square to 0.5 ohms/square, or such as from 0.05 ohms/square to 0.25 ohms/square.

Metals are selectively deposited as one or more layers by methods which include, but are not limited to, electrolytic plating, electroless plating, immersion plating, physical vapor deposition including ionized physical vapor deposition (I-PVD), ionized metal plasma deposition (IMP), CCVD and CACCVD. Metals such as molybdenum, titanium, tantalum and tungsten are deposited by physical vapor deposition. Such methods are known in the art or described in the literature. Conventional plating baths, apparatus and methods may be used.

The width (thickness) of the metal layers may range from 0.5 microns to 25 microns, or such as from 1 micron to 10 microns. The height (thickness) may range from 50 Å to 50,000 Å, or such as from 500 Å to 40,000 Å, or such as from 1000 Å to 30,000 Å, or such as from 5000 Å to 20,000 Å.

A first layer of spinel for encasing the grids is formed as a base and it is deposited on a substrate by CVD. After the spinel base is formed it may be machined, lapped and polished using conventional methods. Such materials may be machined, lapped and polished to have a scratch/dig specification of 120/80 or better such as 80/50. The smaller the scratch/dig specification is the better the polish.

Optionally, one or more bonding layers may be deposited on the spinel base to secure the metal to the base Such bonding layer materials include, but are not limited to, metals such as chromium, titanium, tantalum, nickel, or combinations thereof, or compounds such as titanium nitride, titanium dioxide, silicon or combinations thereof. Bonding layers may range in width (thickness) of from 0.5 microns to 25 microns, or such as from 1 micron to 10 microns. The height (thickness) of the bonding layers may range from 50 Å to 1000 Å, or such as from 100 Å to 500 Å, or such as from 200 Å to 400 Å.

The bonding layers may be deposited using methods which include, but are not limited to, CVD, PVD, CCVD, CAC-CVD, electrolytic deposition and electroless deposition. Typically, the bonding layers are deposited by CVD and PVD, more typically by PVD.

Passivation materials include, but are not limited to, oxides such as metal oxides, and oxides of silicon, metals such as platinum, palladium, gold, rhodium, ruthenium, tantalum, and their alloys. Oxides include, but are not limited to, beryllium oxide, aluminum oxide, silicon dioxide, titanium dioxide, tantalum dioxide, yttrium dioxide and zirconium dioxide. The passivation layers may be alternating layers of two or more of the passivation materials.

The passivation layers may be deposited by methods which include, but are not limited to, electrolytic deposition, CVD, PVD, CCVD, CACCVD. Examples of PVD methods suitable for depositing the passivation layers are by sputtering and e-beam evaporation. Width (thickness) of the passivation layers ranges from 0.5 microns to 25 microns, or such as from 1 micron to 10 microns. The height (thickness) ranges from 50 Å to 40,000 Å, or such as from 500 Å to 30,000 Å, or such as from 1000 Å to 20,000 Å, or such as from 5000 Å to 10,000 Å.

Figure 2:
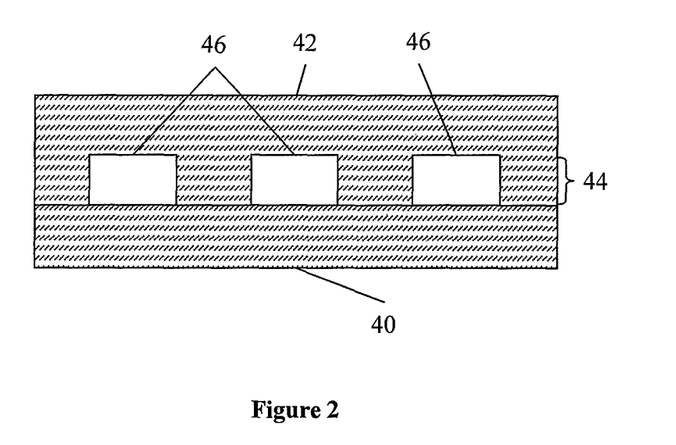
FIG. 2 is a cross-section of an article showing a portion of a patterned electronically conductive and selectively passivated grid enclosed in polycrystalline monolithic magnesium aluminate.
Figure 5:
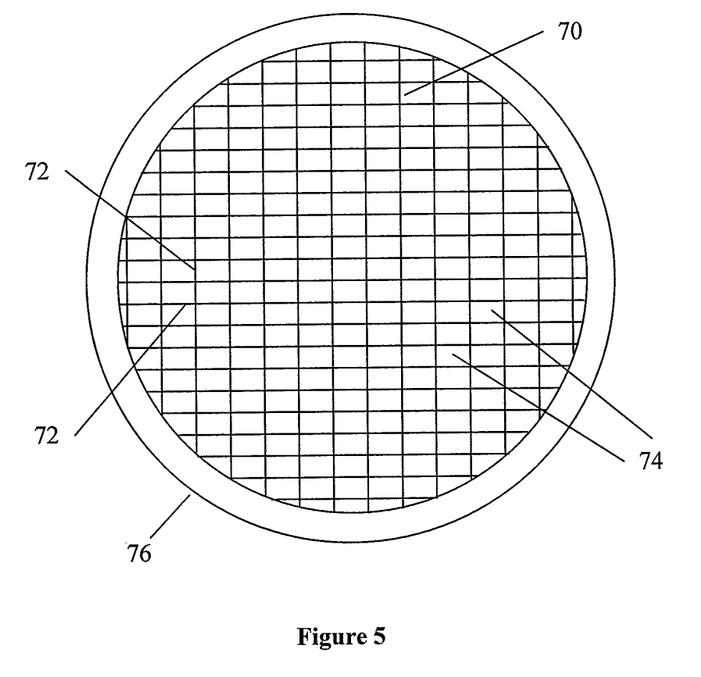
FIG. 5 is a top view showing a grid pattern of an electronically conductive and selectively passivated article in electrical communication with a bus bar.

FIG. 2 illustrates a cross-section of one embodiment of an electrically conductive grid. A base 40 and top coat 42, which are composed of polycrystalline monolithic magnesium aluminate spinel. The electrically conductive pattern 44 has a selectively deposited metal layer 46. The metal layers form an interconnecting grid pattern as illustrated in FIG. 5. The metal of the metal layers 46 can withstand the harsh conditions of CVD deposition of the top coat 42 and adheres well to the base, thus the metal is itself inherently passivated. Such metals include palladium, platinum, gold, tantalum, titanium, tungsten and alloys thereof.

Figure 3:
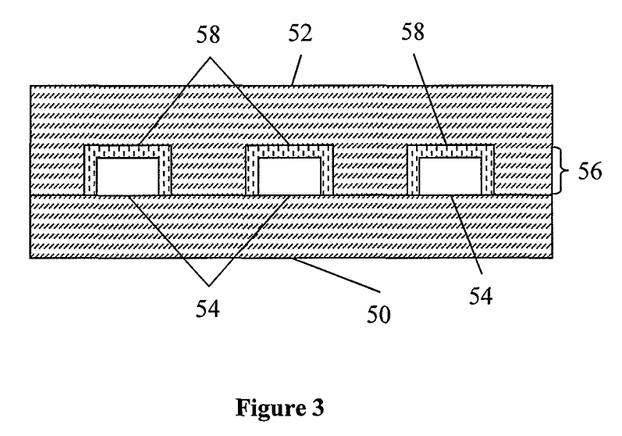
FIG. 3 is a cross-section of a portion of an article showing a patterned electronically conductive and selectively passivated grid enclosed in polycrystalline monolithic magnesium aluminate where the passivation layer is discrete from the metal layer.

FIG. 3 illustrates a cross-section of another embodiment of the optical article. A base 50 and top coat 52, both of which are composed of polycrystalline monolithic magnesium aluminate, enclose selectively deposited metal layers 54 in pattern 56. Each metal layer 54 has a selectively deposited passivation layer 58 encapsulating it. Examples of such metals, which typically are encapsulated with a passivating layer, are PVD gold, copper and their alloys, and molybdenum. Examples of materials used for passivation include aluminum oxide, titanium dioxide, silicon dioxide, platinum, palladium and electrolytic gold.

Figure 4:
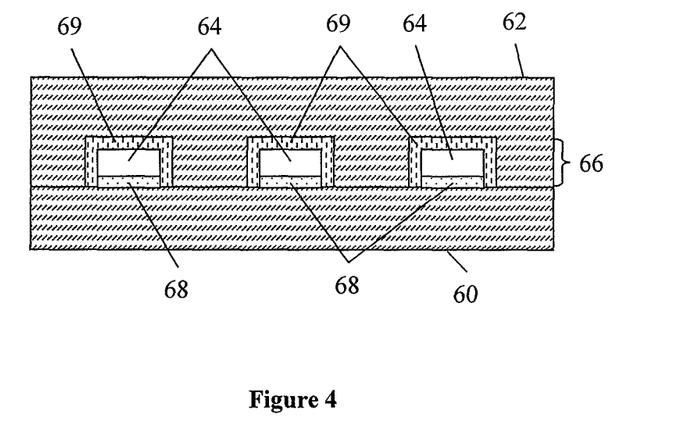
FIG. 4 is a cross-section of a portion of an article showing a patterned electronically conductive and selectively passivated grid enclosed in polycrystalline monolithic magnesium aluminate where the passivation layer is discrete from the metal layer and the metal layer is joined to the base or the article by a discrete bonding layer.

FIG. 4 illustrates a cross-section of an additional embodiment of the optical article. A base 60 and top coat 62, both of which are composed of polycrystalline monolithic magnesium aluminate, enclose selectively deposited metal layers 64 in pattern 66. Metal layers 64 are bonded to base 60 by bonding layers 68. The bonding layers may be a metal different from the metal of metal layers 64 or may be an element such as silicon or an oxide such as titanium dioxide. Selectively deposited passivation layers 69 coat metal layers 64 and bonding layers 68.

FIG. 5 illustrates a top view of an optical article without the top coat. Grid pattern 70 includes the electrically conductive and selectively passivated layers of metal in pattern lines 72. The lines 72 are in electrical communication with each other. Each line 72 is separated from an adjacent line by spaces 74, which is composed of the base material. A bus bar 76 is electrically connected to the grid 70, and the bus bar 76 connects the grid 70 to an electrical power source (not shown). The bus bar may be composed of any suitable metal such as titanium, tantalum, gold, silver, copper or any other conductive metal.

An article may have one or more electrically conductive patterns. Each conductive pattern is separated from an adjacent pattern by one or more layers of the spinel encasing material. Such layers range from 0.5 to 50 mm thick, or such as 1 mm to 24 mm thick, or such as from 5 mm to 15 mm thick.

The patterns may be formed by photolithography processes. For example, after the spinel material is deposited a pattern may be formed with photosensitive materials, such as photoresist or photosensitive inks. The photosensitive material may be applied to the spinel by spray coating, roller coating, lamination or by ink-jet application. A phototool or mask having a desired pattern may be applied to the photosensitive material. When the photosensitive material is applied by ink-jet application, the phototool may be excluded because the ink-jet applies the material as a pattern. The photosensitive material is then exposed to actinic radiation, and portions of the photosensitive material are developed. The remaining photosensitive material forms a pattern of spaces and channels where the layers of the electrically conducting material are to be deposited.

The patterns also may be formed by laser write. Positive photoresist is applied to the dome or article. It is then mounted on a computer controlled gimbal mount. A laser beam is selectively directed at the photoresist. The photoresist is developed and a pattern is formed.

The patterns may have various distances between electrically conducting lines. For example the distances may range from 0.5 µm to 2000 µm, or such as from 10 µm to 1000 µm, or such as from 200 µm to 600 µm, or such as from 50 µm to 100 µm.

The materials for the electrically conducting layers are then deposited in the channels or spaces. The materials, which are deposited by physical vapor deposition, cover the top portions of the photosensitive materials and the channels or spaces of the pattern. Portions of the walls remain uncoated because they are not within the line of sight of deposition. These portions of the walls of the photosensitive materials remain uncoated and a stripper may be used to solubilize or disperse the photosensitive material to remove it. The photosensitive material with any materials deposited on it is removed by lift-off. The electrically conductive layers remain. If both the top portions and walls of the photosensitive material are coated such that a stripper can not make contact with the photosensitive material, laser energy may be applied to remove any coating on the photosensitive material to expose it such that the stripper may contact it. One or more bus bars may be inserted to provide electrical contact between the electrically conductive layers and an outside power source. When one or more passivation layers are desired, the passivation layers may be deposited on the exposed portions of the metal or metal alloy, prior to removing any remaining photosensitive material. The remaining photosensitive material is then stripped with a suitable stripper.

Portions of the metal or metal alloy, which are now exposed, are selectively coated with one or more passivation layers. Alternatively, all of the passivation layers may be selectively deposited on the metal or metal alloy after stripping the photosensitive material. A phototool or mask having suitable dimensions is aligned in relation to the pattern such that one or more layers of the passivation material selectively encapsulates any remaining exposed metal or metal alloy and bonding material.

Phototools or masks used for deposition of the protective or passivation layers have dimensions which depend upon the dimensions of the electrically conductive pattern. Such masks are stencils having apertures which circumvallate the electrically conductive layers. The apertures are sufficiently wide to permit the passage of protective material over, the metal and metal alloy layers and along the sides of the layers during application of the passivation material.

In another embodiment the metal may be oxidized such that a film of metal oxide coats the metal and metal alloy layers. Oxidizing agents include, but are not limited to, hydrogen peroxide, molecular oxygen, ozone, potassium permanganate, potassium dichromate, potassium chlorate, nitric acid, sulfuric acid or mixtures thereof.

Examples of metal oxides formed include, but are no limited to, gold trioxide, silver oxide, copper oxide, beryllium oxide, cobaltous oxide, cobaltic oxide, cobaltocobaltic oxide, titanium dioxide, molybdenum dioxide, molybdenum sesquioxide, molybdenum trioxide, iridium dioxide, rhodium monoxide, rhodium dioxide, rhodium sesquioxide, ruthenium dioxide, tungsten dioxide, tungsten trioxide and tungsten pentaoxide.

Selective passivation means that only the electrically conductive layers along with any bonding layers are encapsulated with the passivation material. Intervening spaces between the electrically conductive pattern do not contain passivation material. This reduces or eliminates the undesired index of refraction of radiation from the article. Accordingly, radiation transmission from the article is improved over many conventional articles.

After the passivation layers are deposited on the electrically conductive patterns, a layer of spinel material is deposited by CVD to enclose the pattern. Because both layers are composed of the same spinel, the interface of the two layers forms a strong bond.

After deposition, the second layer may be machined, lapped and polished using conventional methods. It is machined, lapped and polished to a scratch/dig specification of 120/80 or better such as 80/50. Optionally, an anti-reflection coating may be placed on the article. Such anti-reflection coatings may lower the refractive index of the article. Applying an anti-reflective coating on it may reduce the refractive index to 1.3 and further improve the performance of the article. Such anti-reflective coatings are dielectric materials such as fluorides, metal oxides and alumina.

The following examples further illustrate the invention but are not intended to limit its scope.

EXAMPLE 1

Spinel Production Through Reaction of $AlCl_3$, Mg, $CO_2$, HCl and $H_2$

Spinel is produced by reacting a mixture of $AlCl_3$ gas and Mg vapors with $CO_2$ and $H_2$ on a heated silicon carbide mandrel in a CVD chamber. The spinel is expected to have grain sizes of 70 microns and less. The CVD chamber is made of a quartz tube with SiC liner on the inside of the tube. Two graphite retorts are mounted inside the SiC liner and are used to contain Al and Mg. $AlCl_3$ is produced by reacting solid aluminum with HCl gas at 600-700° C. (reaction 1). Magnesium gas is produced by sublimating Mg at 500-650° C. (reaction 2). Since Mg may react with the quartz tube, the setup is designed such that Mg vapors stay inside the SiC liner and do not come in contact with the quartz tube. This is ensured by plugging the gap between the quartz tube and SiC liners with alumina cloth at the two ends. Inert argon (Ar) gas is always flowing through the Mg retort at temperatures of 20-500° C. to ensure that Mg does not auto-ignite.

$$2Al_{(s)}+6HCl_{(g)}+heat=2AlCl_{3(g)}+3H_{2(g)} \qquad 1.$$

$$Mg_{(s)}+heat=Mg_{(g)} \qquad 2.$$

$$2AlCl_{3(g)}+Mg_{(g)}+3H_{2(g)}+4CO_{2(g)}+heat=MgAl_2O_{4(s)}+ \\ 6HCl_{(g)}+4CO_{(g)} \qquad 3.$$

Since the vapor pressure of Mg is rather low, i.e. 0.7 Torr at 500° C., to flow sufficient quantity of Mg vapors the furnace pressure is kept at 20 Torr. The mandrel temperature is controlled at 900-1150° C. The flow rates of the reagents are as follows:

TABLE 1

| REAGENT | FLOW RATES |
| --- | --- |
| Argon at Aluminum retort | 0.5-0.75 slpm |
| Argon at Magnesium retort | 0.5-1.5 slpm |
| Argon with $CO_2$ and $H_2$ | 0.5-1 slpm |
| HCl | 0.15-0.2 slpm |
| Carbon dioxide | 1-5 slpm |
| $H_2$ | 2-6 slpm |

The average deposition rate is 1 μm/minute. The resulting spinel deposit is expected to be a polycrystalline monolithic aluminate of 1-3 mm thick which is crack free and at least 98% pure (reaction 3). The transmission range of the spinel is expected to be 0.2-6 microns.

EXAMPLE 2

Spinel Production Through Reaction of $AlCl_3$, $MgCl_2$, $CO_2$, HCl and $H_2$

Spinel is produced by reacting a mixture of $AlCl_3$ gas and $MgCl_2$ gas with $CO_2$ and $H_2$ on a heated quartz mandrel in a CVD chamber. The spinel is expected to have grain sizes of 70 microns and less. The CVD chamber is a quartz tube with a quartz liner on the inside of the tube. $AlCl_3$ is produced by reacting solid aluminum with HCl gas at 600-700° C. (reaction 4). $MgCl_2$ gas is produced by sublimating $MgCl_2$ solid at 750-950° C. (reaction 5).

$$2Al_{(s)}+6HCl_{(g)}+heat=2AlCl_{3(g)}+3H_{2(g)} \qquad 4.$$

$$MgCl_{2(s)}+heat=MgCl_{2(g)} \qquad 5.$$

$$2AlCl_{3(g)}+MgCl_{2(g)}+4H_{2(g)}+4CO_{2(g)}+heat= \\ MgAl_2O_{4(s)}+8HCl_{(g)}+4CO_{(g)} \qquad 6.$$

The mandrel temperature is controlled at 900-1150° C. and the furnace pressure is kept in the range of 20-100 Torr. The flow rates of the reagents are as follows:

TABLE 2

| REAGENT | FLOW RATE |
| --- | --- |
| Argon at Aluminum retort | 0.5-1 slpm |
| Argon at Magnesium chloride retort | 0.5-2 slpm |
| Argon with CO$_2$ | 0.5-1 slpm |
| HCl | 0.15-0.2 slpm |
| Carbon dioxide | 1-5 slpm |
| H$_2$ | 2-6 slpm |

Deposition is done for 80 hours to deposit a spinel on the mandrel having a thickness of 4-5 mm. The spinel is produced according to reaction 6. The spinel is expected to be a polycrystalline monolithic magnesium aluminate which is crack free and is at least 98% pure. The spinel is expected to have a transmission in the range of 0.2-6 microns.

EXAMPLE 3

Spinel Production Through Reaction of AlCl$_3$, MgCl$_2$, N$_2$O, HCl and H$_2$

The method describe in Example 2 is repeated except that CO$_2$ is replaced with N$_2$O and Ar is replaced with N$_2$. The flow rate of N$_2$ is the same as Ar and the flow rate of N$_2$O is the same as CO$_2$ in Example 2. The spinel is produced according to reaction 7.

$$2AlCl_{3(g)} + MgCl_{2(g)} + 4H_{2(g)} + 4N_2O_{(g)} + heat = MgAl_2O_{4(s)} + 8HCl_{(g)} + 4N_{2(g)} \qquad 7.$$

Deposition is done until the thickness of the spinel on the mandrel is 4-5 mm thick. The spinel is expected to have the same properties as in Example 2.

EXAMPLE 4

Spinel Production Through Reaction of AlCl$_3$, Mg, N$_2$O, HCl and H$_2$

The method described in Example 1 is repeated except that CO$_2$ is replaced with N$_2$O and the carrier gas is replaced with N$_2$. The flow rate of N$_2$O remains the same as that of CO$_2$ and the flow rate of N$_2$ is the same as Ar in Example 1. The spinel is produced according to reaction 8.

$$2AlCl_{3(g)} + Mg_{(g)} + 3H_{2(g)} + 4N_2O_{(g)} + heat = MgAl_2O_{4(s)} + 6HCl_{(g)} + 4N_{2(g)} \qquad 8.$$

Deposition is done until a thickness of the spinel on the mandrel is 1-3 mm thick. The spinel is expected to have the same properties as in Example 1.

EXAMPLE 5

Spinel Production Through Reaction of Aluminum Acetylacetonate, Mg, O$_2$ and N$_2$ Spinel is produced by reacting a mixture of aluminum acetylacetonate and Mg vapors with O$_2$ on a heated alumina mandrel in a CVD chamber. The spinel is expected to have a grain size of 70 microns and less. The CVD chamber includes a quartz tube with an alumina liner on the inside of the tube. Aluminum acetylacetonate gas is produced by sublimating solid aluminum acetylacetonate in a retort at a temperature range of 140-170° C. Magnesium gas is produced by sublimating Mg at 500° C. Since Mg reacts with quartz tube the setup is designed as in Example 1 such that Mg vapors stay inside the alumina liner and do not come in contact with the quartz tube. Additionally, the retort containing the magnesium is kept below magnesium auto-ignition temperature of 510° C. and keeping inert argon gas flowing through the magnesium retort.

The CVD chamber pressure is kept at 10-20 Torr since the vapor pressure of magnesium is 0.7 Torr at 500° C. The mandrel temperature is controlled at 900-1100° C. The flow rates are as follows:

TABLE 3

| REACTANT | FLOW RATE |
| --- | --- |
| Argon at Aluminum retort | 0.5-0.75 slpm |
| Argon at Magnesium retort | 0.5-2 slpm |
| Argon with O$_2$ | 0.5-1 slpm |
| Oxygen | 0.5-1 slpm |

The spinel deposition is performed for 50 hours. The deposition is expected to produce a polycrystalline monolithic magnesium aluminate spinel with an average thickness on the mandrel of 2.5-3.5 mm. The spinel is generated (machined) on a rotary grinder and then lapped on a lapping machine with diamond slurry of grit size 32-0.5 µm. Finally, the lapped spinel is polished on a polishing spindle using fine diamond powder solution. The spinel is expected to be crack free and 98% pure. The spinel is expected to have a transmission of 0.2-6 microns.

EXAMPLE 6

Spinel Production Through Reaction of Aluminum Acetylacetonate, Mg, O$_2$, H$_2$O and N$_2$ The method describe in Example 5 is repeated except that water is added to the reaction mixture. Water is added by flowing N$_2$, which mixes with O$_2$, at a rate of 0.5-1 slpm through a water bubbler. The resulting polycrystalline monolithic magnesium aluminate spinel is expected to have the same properties as in Example 5.

EXAMPLE 7

Spinel Production Through Aluminum Acetylacetonate, Mg, H$_2$O$_2$, H$_2$O and N$_2$ The method describe in Example 5 is repeated except that hydrogen peroxide is used as the source of oxygen. A 30% H$_2$O$_2$ solution in water is used and N$_2$ is bubbled through the H$_2$O$_2$ to carry a mixture of H$_2$O$_2$ and H$_2$O to the deposition area of the CVD chamber. The flow rate of N$_2$ is 0.5-2 slpm and the temperature of the H$_2$O$_2$ bubbler is maintained at 20° C.

EXAMPLE 8

Spinel Production Through Reaction of Aluminum Acetylacetonate, Mg, O$_3$ and N$_2$ Spinel is produced by reacting a mixture of aluminum acetylacetonate and Mg with O$_3$ on a heated quartz mandrel in a CVD chamber. O$_3$ is provided by an O$_3$ generator. The spinel is expected to have a grain size of 70 microns and less. The CVD chamber includes a quartz tube with a quartz liner on the inside of the tube. Aluminum acetylacetonate gas is produced by sublimating solid aluminum acetylacetonate in a retort at a temperature range of 140-170° C. and Mg gas is produced by sublimating Mg at 500° C. Nitrogen is used as a carrier gas to carry the precursors to the deposition area of the chamber. $O_3$ is mixed with $N_2$ and is separately introduced in the deposition area. The mandrel temperature is controlled at 100-600° C. The CVD chamber pressure is maintained in a range of 20-100 Torr. The flow rates of the reagents are as follows:

TABLE 4

| REAGENT | FLOW RATE |
| --- | --- |
| $N_2$ at Aluminum retort | 0.5-1 slpm |
| $N_2$ at Magnesium retort | 0.5-2.5 slpm |
| $N_2$ with $O_3$ | 0.5-1 slpm |
| $O_3$ | 0.5-1 slpm |

The spinel deposition is performed for 30 hours. The deposition produces a polycrystalline monolithic magnesium alumina spinel on the mandrel with an average thickness of 0.5-1 mm. The material is machined, lapped and polished. The spinel is expected to be crack free and at least 98% pure. The spinel has a transmission of 0.2-6 microns.

EXAMPLE 9

Spinel Production Through Aluminum and Magnesium Acetylacetonate, $H_2O$ and $N_2$ Spinel is produced by reacting a mixture of aluminum acetylacetonate and magnesium acetylacetonate with $H_2O$ on a heated quartz mandrel in a CVD chamber. The spinel is expected to have grain sizes of 70 microns and less. The CVD chamber includes a quartz tube with a quartz liner on the inside of the tube. Aluminum acetylacetonate gas is produced by sublimating solid aluminum acetylacetonate at a temperature range of 140-170° C. Magnesium acetylacetonate gas is produced by sublimating magnesium acetylacetonate at a temperature range of 100-300° C. The mandrel temperature is controlled in a range of 250-600° C. and the CVD chamber pressure is maintained at a range of 20-100 Torr. The flow rates of the reagents are as follows:

TABLE 5

| REAGENT | FLOW RATE |
| --- | --- |
| $N_2$ at Aluminum retort | 0.5-1.5 slpm |
| $N_2$ at Magnesium retort | 0.5-1.5 slpm |
| $N_2$ bubbling through $H_2O$ | 1-2.5 slpm |

The spinel deposition is performed for 30 hours. The deposition produced a polycrystalline monolithic magnesium aluminate spinel with a thickness of 0.5-1.5 mm thick. The spinel is expected to be crack free and at least 98% pure. The transmission is expected to be in a range of 0.2-6 microns.

EXAMPLE 10

Spinel Durable Coating on CLEARTRAN™ ZnS

Spinel is produced by reacting a mixture of aluminum acetylacetonate and magnesium gas with oxygen to produce a polycrystalline monolithic magnesium aluminate with grain sizes of 70 microns and less. The CVD chamber includes a quartz tube with an alumina liner on the inside of the tube. The mandrels are made of alumina and three 5 cm diameter CLEARTRAN™ ZnS polished substrates (available from Rohm and Haas Company through its Advanced Materials Business, Woburn, Mass., USA) are placed on the bottom of the mandrel in the deposition area of the chamber. Aluminum acetylacetonate gas is produced by sublimating solid aluminum acetylacetonate in a temperature range of 140-170° C. Magnesium gas is produced by sublimating Mg (s) at 500° C. Since Mg reacts with quartz the setup is designed such that Mg gas stays inside of the alumina liner and does not come in contact with the quartz tube as describe in Example 1. Additionally, the Mg retort is kept at a temperature below 510° C. and inert Ar gas is always kept flowing through the retort to prevent auto-ignition of Mg.

The mandrel temperature is maintained at 550° C. and the chamber pressure is at 20 Torr. The flow rate of the reagents is as follows:

TABLE 6

| REAGENT | FLOW RATE |
| --- | --- |
| Ar at Aluminum retort | 0.5-0.75 slpm |
| Ar at Magnesium retort | 0.5-1.5 slpm |
| Ar with $O_2$ | 0.5-1 slpm |
| Oxygen | 0.5-1 slpm |

The deposition is done for 25 hours. The deposition produces a polycrystalline monolithic magnesium aluminate spinel coating on the ZnS substrates with a thickness range of 0.75-1 mm. The deposits are expected to be crack free and at least 98% pure. Transmission in the range of 0.2-6 microns is expected.

Each coating is tested for its adhesion to the ZnS substrates. The conventional ASTM D-3359-02 tape test is performed by applying tape to the spinel coating and pulling the tape off. No spinel material is expected to be seen on the tape after pulling it from the coating.

EXAMPLE 11

Spinel Articles with Titanium-Tungsten (Ti—W) Conductive Layer

Polycrystalline monolithic magnesium aluminate is produced by the method disclosed in Example 1. The silicon carbide mandrel is a flat rectangular shaped mandrel. The average deposition rate of the magnesium aluminate precursors is 5 microns/minute.

After the spinel is deposited on the mandrel, the deposit is removed from the mandrel and machined to remove any silicon carbide contaminant and to smooth the surface. The spinel is then machined to the required dimensions, and lapped and polished using conventional methods to polishing specifications of scratch/dig=80/50.

The polished spinel is then coated with a negative acting photoresist and exposed to radiation through a patterned mask to form line widths of 10 microns and spacings between the lines of 300 microns and a continuous coated area around the periphery of 1 cm wide to act as a buss bar to make electrical contact to a metal grid to be placed on the spinel. The unexposed photoresist is developed away to form pattern lines on the spinel substrate.

Titanium metal having a thickness of 300 Å is deposited on the pattern lines using an e-beam deposition method to form the grid. A 20,000 Å layer of titanium-tungsten (Ti—W) having a composition of 10% titanium and 90% tungsten is deposited on the titanium by sputtering. The photoresist remaining on the spinel is stripped using acetone.

The spinel with the electrical conducting pattern is placed in a CVD chamber. The bus bar area is protected with a graphite fixture to prevent deposition of magnesium aluminate spinel in this area. The deposition method described in Example 1 is used to deposit spinel material on the passivated metal grid. After deposition is complete the article is machined, lapped and polished to a scratch/dig ratio of 80/50 and a thickness of 1 mm. The article with the buried electrical conducting pattern is expected to have a transmission in the range of 0.2-6 microns. The sheet resistance of the conducting pattern is expected to be less than 0.5 ohms/square.

EXAMPLE 12

Spinel Articles with Molybdenum (Mo) Conductive Layer

Polycrystalline monolithic magnesium aluminate substrates are prepared according to the method of Example 1 except that the mandrels are made of alumina. A photoresist pattern is applied to the polycrystalline monolithic magnesium aluminate substrates as described in Example 11.

Titanium metal having a thickness of 300 Å is deposited on the pattern lines using a conventional sputtering deposition method. After the deposition of the titanium layer, a layer of titanium dioxide having a thickness of 500 Å is deposited on the titanium layer by a conventional e-beam physical vapor deposition method. Molybdenum having a thickness of 10,000 Å is deposited on the titanium dioxide layer by a conventional sputtering deposition technique. The photoresist remaining on the spinel is stripped using acetone. In order to passivate and protect the exposed Ti/TiO$_2$/Mo metal during the subsequent overcoat deposition, the articles with the exposed Ti/TiO$_2$/Mo metallic pattern are heated to 250° C. for at least one hour in an atmosphere of oxygen to oxidize the exposed Ti/TiO$_2$/Mo on all sides.

A spinel top coat is deposited on each spinel base with the conductive grid using the CVD method as described in Example 1. After deposition of the top layer, the article is machined, lapped and polished to a scratch/dig ratio of 80/50. The articles are expected to have a transmission in the range of 0.2-6 microns. The sheet resistance of the conducting patterns is expected to be less than 1 ohm/square.

EXAMPLE 13

Spinel Articles with Gold Conducting Layer Passivated with Platinum

A polycrystalline monolithic magnesium aluminate spinel is prepared by the method described in Example 2 except the mandrels are made of alumina.

After deposition is complete the spinel is removed from the mandrels and machined to remove any alumina contaminants and to smooth the surface. A square pattern is then formed on the spinels using photolithographic and physical vapor deposition processes. A negative-acting photoresist is roller coated on the spinels to a thickness of 1 micron. A phototool having the desired pattern is applied to the negative-acting photoresist and exposed to UV radiation with a conventional UV lamp for a sufficient time to cure the exposed portions of the photoresist. After the photoresist is cured it is developed in a 1 wt % solution of sodium carbonate monohydrate to remove the unexposed portions of the photoresist.

The imaged spinel substrates are then placed in a conventional e-beam chamber to deposit a chromium bonding layer. Chromium deposition proceeds until a layer (height) of 200 Å of chromium is deposited on the spinel portions not covered by cured photoresist. The chamber is then cleaned and the parameters are set for e-beam deposition of gold on the chromium bonding layer. Gold is deposited on the chromium bonding layer until a layer (height) of gold of 5000 Å is formed.

After the layers of chromium and gold are deposited, the remaining photoresist is stripped with acetone. After stripping the spinel substrates with the chromium and gold layers are prepped for passivation.

The substrates are first electrolytically cleaned in a bath of RONACLEAN™ GP-300 LF for 10 seconds at a current density of 1 A/dm$^2$ and at a bath temperature of 50° C. The substrates are then removed and immersed in a 25 wt % solution of sulfuric acid for 10 seconds at room temperature. After acid cleaning the substrates are removed and rinsed with tap water. The substrates are then placed in a platinum metal electroplating bath.

The platinum bath includes 20 gm/L of chloroplatinic acid, which provides a platinum ion concentration of 15 gm/L. The bath also includes 300 gm/L of hydrogen chloride. The pH of the bath is less than 1.

The current density is 15 A/dm$^2$. Plating is done until the chromium and gold layers are encapsulated with 5000 Å (height) of platinum. The width of the metal plated lines is 15 microns and the spacing between the lines is 520 microns.

The spinels with the selectively passivated grids are then placed in a CVD chamber where they are coated with polycrystalline monolithic magnesium aluminate to a thickness of 7 mm. The coating method is the same method as described in Example 2 above. The articles are machined, lapped and polished to a scratch/dig ratio of 80/50.

The articles are expected to be crack free and they are expected to have a transmission in the range of 0.2-6 microns.

EXAMPLE 14

Spinel Articles with Gold Conductive Layer Passivated with Gold

A chromium bonding layer is deposited on polycrystalline monolithic magnesium aluminate substrates as described in Example 13. A gold layer is then deposited on the chromium layer by physical vapor deposition as described in Example 13 to form a gold layer of 5000 Å (height). After the layer of gold is deposited on the chromium layer, the substrates are then electrically cleaned in a bath of RONACLEAN™ GP-300 LF for 10 seconds, and also cleaned for 10 seconds in a bath of 25 wt % sulfuric acid. The spinel substrates are then rinsed with tap water for 5 seconds.

The cleaned substrates are then selectively passivated with electrolytic gold. The substrates are placed in an electrolytic gold bath (AURALL™ 364A STRIKE, obtainable from Rohm and Haas Electronic Materials, L.L.C., Marlborough, Mass.) and electrolytic gold is deposited over the chromium and physical vapor deposited gold for a period of 60 seconds to encapsulate them. The pH of the bath is 4 and the bath temperature is 40° C. The current density is 0.2 A/dm$^2$ during gold deposition. The electrolytic gold forms a gold layer 4500 Å thick (height).

The spinel substrates with the electrically conductive and selectively passivated patterns are then top coated with spinel according the method described in Example 13.

The final articles are expected to be crack free and have a transmission in the range of 0.2-6 microns. The sheet resistance of the conducting pattern is expected to be less than 0.6 ohms/square.

EXAMPLE 15

Spinel Fabrication Through Reaction of $AlCl_3$, $MgCl_2$, $CO_2$, HCl and $H_2$ Spinel was produced by reacting a mixture of $AlCl_3$ and $MgCl_2$ vapors with $CO_2$ and $H_2$ on a heated quartz mandrel in a CVD chamber. The CVD chamber was made of a quartz tube with a secondary quartz liner tube inside of the main tube. Two graphite retorts were mounted inside the main tube and were used to contain Al and $MgCl_2$. $AlCl_3$ was produced by reacting solid aluminum with HCl gas at a temperature of 600° C. (reaction 1). A mixture of HCl and $N_2$ was passed through the Al retort to carry the $AlCl_3$ to the reaction area. $MgCl_2$ gas was produced by sublimating $MgCl_2$ solid at 850° C. (reaction 2). Nitrogen was passed through the $MgCl_2$ retort to carry $MgCl_2$ vapors to the reaction area. A mixture of $CO_2$, $H_2$ and $N_2$ was passed through the central injector connected to the reaction zone.

The mandrel temperature was controlled at 1000° C. and the furnace pressure was kept at pressures of 50 and 100 Torr. The flow rates of the reagents were as follows:

TABLE 7

| REAGENT | FLOW RATE |
| --- | --- |
| Nitrogen at Aluminum retort | 0.5 slpm |
| Nitrogen at Magnesium chloride retort | 0.6-0.8 slpm |
| Nitrogen with $CO_2$ | 0.5 slpm |
| HCl | 0.10-0.15 slpm |
| Carbon dioxide | 1-1.5 slpm |
| $H_2$ | 2-3 slpm |

The deposition was performed on four quartz mandrels which were arranged in the form of an open box inside the liner tube. Some of the mandrels were coated with mold release coatings. Each deposition was performed for 8 hours. After the deposition, a uniform coating was observed on the inlet flange and mandrels. The top surface of the deposit was observed under an optical microscope and showed the presence of small crystallites. Scanning electron microscope energy dispersive X-ray analysis (SEM-EDS) using Hitachi S-3400N VP-SEM system and X-ray photoelectron spectroscopy (XPS) analyses were performed on the deposits and indicated strong peaks of Al, Mg and O. An X-ray diffraction scan of the deposit with Rigaku D Max 2500 using copper k alpha=1.54 Å wavelength indicated the presence of spinel. Seven strong X-ray diffraction peaks observed for spinel were located at (2 Theta, "d" values (Å)) of (19.001, 4.6668), (31.273, 2.8578), (36.849, 2.4371), (44.814, 2.0208), (55.66, 1.65), (59.362, 1.5556) and (65.241, 1.4289).

What is claimed is:

1. A method comprising:
   a) providing gaseous precursors of polycrystalline monolithic magnesium aluminate in a chemical vapor deposition chamber, wherein a source of magnesium is chosen from magnesium halides and a source of aluminum is chosen from aluminum halides, aluminum carbonyls and aluminum acetonates and a source of oxygen is chosen from $O_2$, $CO_2$, $NO_2$, $H_2O_2$, $O_3$, $N_2O$ and $H_2O$;
   b) reacting the gaseous precursors in the chemical vapor deposition chamber; and
   c) chemical vapor depositing polycrystalline monolithic magnesium aluminate on a substrate in the chemical vapor deposition chamber at a deposition rate of 0.1 μm/minute to 5 μm/minute, the temperature of the substrate is 700° C. to 1400° C.

2. The method of claim 1, wherein the magnesium halides are chosen from $MgCl_2$, $MgBr_2$, $MgI_2$ and $MgF_2$.

3. The method of claim 1, wherein the aluminum halides are chosen from $AlCl_3$, $AlBr_3$, $AlI_3$ and $AlF_3$.

4. The method of claim 1, wherein the deposition rate is from 0.5 μm/minute to 2 μm/minute.

5. The method of claim 1, wherein the temperature of the substrate is 1100° C. to 1400° C.

* * * * *